(12) United States Patent
Zhu et al.

(10) Patent No.: US 8,860,927 B2
(45) Date of Patent: Oct. 14, 2014

(54) DUAL-STAGE EXCHANGE SYSTEM FOR LITHOGRAPHIC APPARATUS

(75) Inventors: Yu Zhu, Beijing (CN); Ming Zhang, Beijing (CN); Jingsong Wang, Beijing (CN); Li Tian, Beijing (CN); Dengfeng Xu, Beijing (CN); Wensheng Yin, Beijing (CN); Guanghong Duan, Beijing (CN); Jinchun Hu, Beijing (CN)

(73) Assignee: Tsinghua University, Beijing (CN)

( * ) Notice: Subject to any disclaimer, the term of this patent is extended or adjusted under 35 U.S.C. 154(b) by 631 days.

(21) Appl. No.: 13/262,829

(22) PCT Filed: Apr. 2, 2010

(86) PCT No.: PCT/CN2010/071551
§ 371 (c)(1),
(2), (4) Date: Dec. 14, 2011

(87) PCT Pub. No.: WO2010/111973
PCT Pub. Date: Oct. 7, 2010

(65) Prior Publication Data
US 2012/0099095 A1 Apr. 26, 2012

(30) Foreign Application Priority Data
Apr. 3, 2009 (CN) .......................... 2009 1 0131507

(51) Int. Cl.
*G03B 27/58* (2006.01)
*G03F 7/20* (2006.01)

(52) U.S. Cl.
CPC ................. *G03F 7/70733* (2013.01)
USPC ............................................ 355/72; 355/53

(58) Field of Classification Search
CPC .... B23Q 1/621; B23Q 1/623; B23Q 11/0032; G03F 7/70716; G03F 7/70741; G03F 7/7075; G03F 7/709; G03F 7/70733; H01L 21/682
USPC ......................... 355/30, 53, 72, 77
See application file for complete search history.

(56) References Cited

U.S. PATENT DOCUMENTS

| 6,262,796 | B1 | 7/2001 | Loopstra et al. |
| 2002/0196421 | A1 | 12/2002 | Tanaka et al. |
| 2006/0033043 | A1 | 2/2006 | Arai |
| 2006/0187431 | A1 | 8/2006 | Shibazaki |

FOREIGN PATENT DOCUMENTS

| CN | 101571676 A | 11/2009 |
| EP | 1 582 932 A2 | 10/2005 |
| JP | 2005-038874 A | 2/2005 |
| JP | 2005-353969 A | 12/2005 |
| WO | WO 2009/009947 A1 | 1/2009 |

OTHER PUBLICATIONS

International Search Report for PCT/CN2010/071551 filed on Apr. 2, 2010.

*Primary Examiner* — Mesfin T Asfaw

(57) ABSTRACT

A dual-stage exchange system for a lithographic apparatus comprises a silicon chip stage (13) operating in an exposure workstation (3) and a silicon chip (14) stage operating in a pre-processing workstation (4). The two silicon chip stages (13, 14) are provided on the same base stage (1), and suspended on an upper surface (2) of the base stage by air bearings. The two silicon chip stages (13, 14) can move along guide rails (15, 16) in the Y direction. One end of each guide rail (15, 16) is connected to a main driving unit (11, 12), and the other end of each guide rail (15, 16) is butt-jointed with an X-direction single-freedom auxiliary driving unit (7, 8). The silicon chip stages (13, 14) are driven by the single-freedom auxiliary driving units (7, 8) cooperated with the main driving units (11, 12) to move along the X direction. The single-freedom auxiliary driving units (7, 8) can be separated from or precisely butt-jointed with the Y-direction guide rails (15, 16), thereby achieving the position exchange of the two silicon chip stages (13, 14).

4 Claims, 4 Drawing Sheets

DUAL-STAGE EXCHANGE SYSTEM FOR LITHOGRAPHIC APPARATUS

TECHNICAL FIELD

The present invention relates to a dual-stage exchange system for a lithographic apparatus, which is applied to a semiconductor lithographic apparatus and belongs to the field of semiconductor manufacturing equipments.

BACKGROUND

In the process of manufacturing integrated circuit chips, exposure and transfer (lithography) of designed pattern for a chip on photoresist on wafer surface is one of the most important steps which is implemented by an apparatus called lithographic apparatus (exposure device). The resolution and exposure efficiency of a lithographic apparatus greatly influence the characteristic linewidth (resolution) and productivity of IC chips. The motion accuracy and operation efficiency of an ultraprecise wafer moving and positioning system (hereinafter referred as wafer stage), which is a critical system of a lithographic apparatus, determine to a large extent the resolution and exposure efficiency of a lithographic apparatus.

The fundamental principle of a step-and-scan projection lithographic apparatus is shown in FIG. 1. Deep ultraviolet light from a light source 45 transmits through a mask 47 and a lens system 49 to image a part of pattern on the mask onto certain chip of a wafer 50. The mask and the wafer move synchronously in opposite directions with certain velocity ratio so as to image the entire pattern on the mask onto the certain chip on the wafer.

The basic function of a wafer moving and positioning system is to carry a wafer and move at preset speed and in a preset direction during exposure to allow precise transfer of a mask pattern to various areas on the wafer. Due to the small linewidth of chips (smallest linewidth of 45 nm available presently), it is required that the wafer stage has extremely high moving and positioning accuracy in order to ensure overlay accuracy and resolution of lithography. Furthermore, since the movement velocity of a wafer stage influences the productivity of lithography to a large extent, it is desired to continuously improve movement velocity of a wafer stage from the view point of increasing productivity.

For traditional wafer stages, such as those described in patents EP 0729073 and U.S. Pat. No. 5,996,437, only one wafer moving and positioning unit, i.e., one wafer stage, is disposed in each lithographic apparatus. Preparations such as leveling and focusing are all implemented on the stage, which require a long time. Particularly, alignment requires a very long time since it needs low velocity scanning (typical alignment scanning velocity is 1 mm/s) with extremely high accuracy. It is very difficult to decrease its operation time. Therefore, in order to improve productivity of lithographic apparatus, movement velocity of wafer stages in terms of stepping and exposure scanning must be increased. However, increased velocity would inevitably lead to deterioration of dynamic performance of the system, and a lot of technical measures should be adopted to guarantee and enhance movement accuracy of wafer stages, which will incur much higher cost for retaining existing accuracy or achieving higher accuracy.

Patent WO 98/40791 (published on Sep. 17, 1998, Netherlands) described a structure with two wafer stages, in which exposure preparation works such as wafer loading and unloading, pre-alignment and alignment are transferred to a second stage that moves simultaneously with and independently from the exposure stage. While movement velocity of wafer stages is not increased, substantial preparation works by the exposure stage are now undertaken by the second stage, which significantly reduces operation time of each wafer on the exposure stage, greatly improving productivity. However, the system has a major drawback of non-centroid driving for wafer stage system.

Patent of invention titled "Dual-stage exchange system for Lithographic apparatus" filed by the applicant of the present application in 2007 (Publication No.: CN101101454) disclosed a dual-stage exchange system for lithographic apparatus, which has advantages such as simple structure and high space utilization and thereby improving exposure efficiency of lithographic apparatus. However this two-stage system still suffers some problems. First of all, air bearings need to exchange guiding surfaces upon wafer stage exchange, which imposes extremely high accuracy requirement for dimensional uniformity between wafer stages and requires micron scale or higher accuracy for components processed and assembled. Secondly, it is difficult to mount a sensor for detecting positions with respect to each other between guide rails involved in exchange, and upper linear guide rails tend to collide. The third problem is non-centroid driving of wafer stage system.

SUMMARY

Technical Problem

In view of the shortages and defects of prior art, an object of the present invention is to provide a novel dual-stage exchange system for a lithographic apparatus to overcome shortcomings of existing stage exchange system such as non-centroid driving and extremely high accuracy requirements for processing and assembling, which has simple structure, high space utilization and avoids collision between upper linear guide rails during exchange, hence improving exposure efficiency of lithographic apparatuses.

Technical Solution

The first technical solution of the present invention is as follows:

An alternative exchange mode for a dual-stage exchange system for a lithographic apparatus, the system comprising a first stage 13 operating at an exposure workstation 3 and a second stage 14 operating at a pre-processing workstation 4, the two wafer stages being disposed on a same rectangular base 1 with long side in X direction and short side in Y direction, the two wafer stages being over a top surface 2 of the base, characterized in that: disposed at the two long sides of the base are the stator 5a of a first Y linear motor, the stator 6a of a second Y linear motor, the stator 5b of a third Y linear motor and the stator 6b of a fourth Y linear motor respectively. The second 1-DOF (degree of freedom) auxiliary driving unit 8 uses the stator 5a of the first Y linear motor, the first main driving unit 11 uses the stator 5b of the second Y linear motor. The second main driving unit 12 uses the stator 6a of the third Y linear motor, the first 1-DOF auxiliary driving unit 7 uses the stator 6b of the fourth Y linear motor; the first Y-direction guide rail 15 passes through the first stage 13 and the second Y-direction guide rail 16 passes through the second stage 14; the first Y-direction guide rail 15 has one end connected with the first main driving unit 11 and the other end butt-jointed with the first 1-DOF auxiliary driving unit 7, the first 1-DOF auxiliary driving unit 7 and the first Y-direction guide rail 15 are in separate structure by which they are disconnected upon position exchange of the two wafer stages; the second Y-direction guide rail 16 has one end connected with the second main driving unit 12 and the other end butt-jointed with the second 1-DOF auxiliary driving unit 8, the second 1-DOF auxiliary driving unit 8 and the second Y-direction guide rail 16 are in separate structure by which they are disconnected upon position exchange of the two wafer stages.

When the two wafer stages exchange their positions, first of all, the first stage 13 moves toward the first main driving unit 11 along the first Y-direction guide rail 15, and the second stage 14 moves toward the second main driving unit 12 along the second Y-direction guide rail 16; then, the first Y-direction guide rail 15 separates from the first 1-DOF auxiliary driving unit 7 and moves toward the first main driving unit 11, and the second Y-direction guide rail 16 separates from the second 1-DOF auxiliary driving unit 8 and moves toward the second main driving unit 12; then, the first main driving unit 11 and the second main driving unit 12 drive the first stage 13 and the second stage 14 respectively to experience station exchange, meanwhile, the second 1-DOF auxiliary driving unit 8 and the first 1-DOF auxiliary driving unit 7 move to initial positions of the exposure workstation 3 and the pre-processing workstation 4 respectively; finally, the first Y-direction guide rail 15 and the second 1-DOF auxiliary driving unit 8 are butt-jointed together, and the first stage 13 moves to an initial position of the pre-processing workstation 4, the second Y-direction guide rail 16 and the first 1-DOF auxiliary driving unit 7 are butt-jointed, and the second stage 14 moves to an initial position of the exposure workstation 3, the exchange is completed and the system enters a next cycle.

In the above technical solution, said first 1-DOF auxiliary driving unit 7 and said second 1-DOF auxiliary driving unit 8 are both provided with linear motor rotors 17 at their bottom, each 1-DOF auxiliary driving unit is provided with a vacuum preloaded air bearing 19 on its side that contacts the base, each 1-DOF auxiliary driving unit is provided with a permanent magnetism preloaded air bearing 20 on its bottom surface that contacts the base; said first main driving unit 11 and said second main driving unit 12 are 2-DOF driving units that are each mounted a linear motor rotor 17 at the bottom same as that of the 1-DOF auxiliary driving unit, each main driving unit is provided with a vacuum preloaded air bearing 19 on its side that contacts the base, each main driving unit is provided with a permanent magnetism preloaded air bearing 20 on its bottom surface that contacts the base, and further, between a top of each main driving unit and the Y-direction guide rail, a roller ball guide rail or an air bearing is mounted for guiding and a linear motor or a friction wheel plus stepper motor is mounted for driving, so as to enable the main driving unit to drive and support of the Y-direction guide rail.

The said dual-stage exchange system for a lithographic apparatus according to the present application is characterized further in that: a linear grating for position feedback is mounted on the linear motor of each said driving unit respectively. The system further comprises a dual frequency laser interferometer for position feedback of wafer stage movement.

Advantageous Effects

Compared with prior art, the present invention has the following significant advantages: First of all, the wafer stages of the system are centroid-driven. Secondly, the exchange surface does not use air bearing, which has low requirement for dimensional uniformity. Thirdly, both auxiliary driving units are of single degree of freedom, which simplifies the control system structure and relaxes accuracy requirement for mounting system components.

Figure 1:
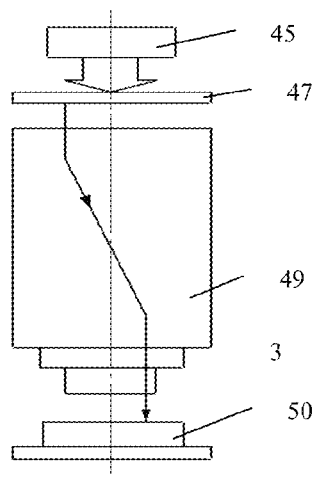
FIG. 1 is a schematic diagram illustrating operating principle of a lithographic apparatus.

In the drawings: 1-base; 2-top surface of base; 3-exposure workstation; 4-pre-processing workstation; 5a-stator of the first Y linear motor; 5b-stator of the second Y linear motor; 6a-stator of the third Y linear motor; 6b-stator of the fourth Y linear motor; 7-first 1-DOF auxiliary driving unit; 8-second 1-DOF auxiliary driving unit; 11-first main driving unit; 12-second main driving unit; 13-first stage; 14-second stage; 15-first Y-direction guide rail; 16-second Y-direction guide rail; 17-linear motor rotor of 1-DOF auxiliary driving unit; 18-linear motor rotor of main driving unit; 19-vaccum preloaded air bearing; 20-permanent magnetism preloaded air bearing; 21-linear motor stator magnetic steel of Y-direction guide rail; 22-air bearing on bottom surface of stage; 23-air bearing for main driving unit and Y-direction guide rail; 24-closed preloaded air bearing; 25a-side of Y-direction guide rail for butting; 25b-side of 1-DOF auxiliary driving unit for butting; 45-light source; 47-mask; 49-lens system; 50-wafer.

DETAILED DESCRIPTION

Figure 2:
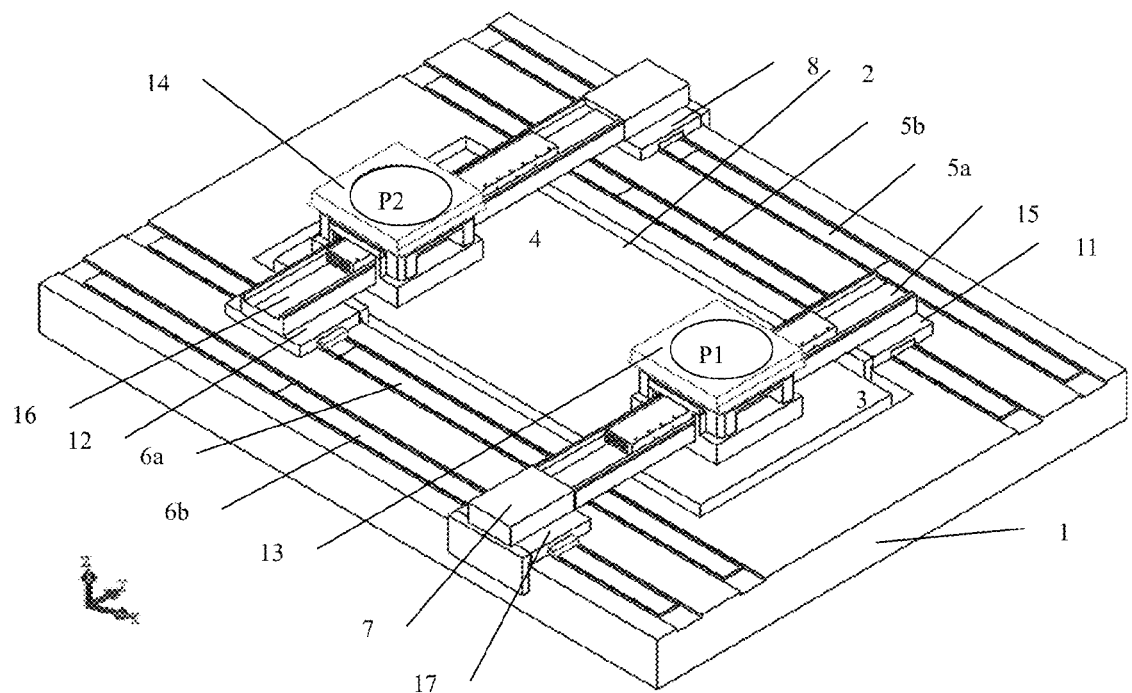
FIG. 2 shows a dual-stage exchange system for lithographic apparatus according to the present invention and its state before exchange.

FIG. 2 shows a structural representation of a dual-stage exchange system for a lithographic apparatus. The system includes two wafer stages disposed on a same rectangular base 1 with long sides in X direction and short sides in Y direction. The two wafer stages are located over a top surface 2 of the base. Disposed at the two long sides of the base are a stator 5a of a first Y linear motor, a stator 6a of a second Y linear motor, a stator 5b of a third Y linear motor and a stator 6b of a fourth Y linear motor respectively. The second 1-DOF auxiliary driving unit 8 uses the stator 5a of the first Y linear motor. The first main driving unit 11 uses the stator 5b of the second Y linear motor. The second main driving unit 12 uses the stator 6a of the third Y linear motor. The fourth 1-DOF auxiliary driving unit 10 uses the stator 6b of the fourth Y linear motor.

The first Y-direction guide rail 15 passes through the first stage 13 and the second Y-direction guide rail 16 passes through the second stage 14. The first Y-direction guide rail 15 has one end connected with the first main driving unit 11 and the other end butt-jointed with the first 1-DOF auxiliary driving unit 7. The first 1-DOF auxiliary driving unit 7 and the first Y-direction guide rail 15 are in separate structure by which they are disconnected upon position exchange of the two wafer stages. The second Y-direction guide rail 16 has one end connected with the second main driving unit 12 and the other end butt-jointed with the second 1-DOF auxiliary driving unit 8. The second 1-DOF auxiliary driving unit 8 and the second Y-direction guide rail 16 are in separate structure by which they are disconnected upon position exchange of the two wafer stages.

Figure 3:
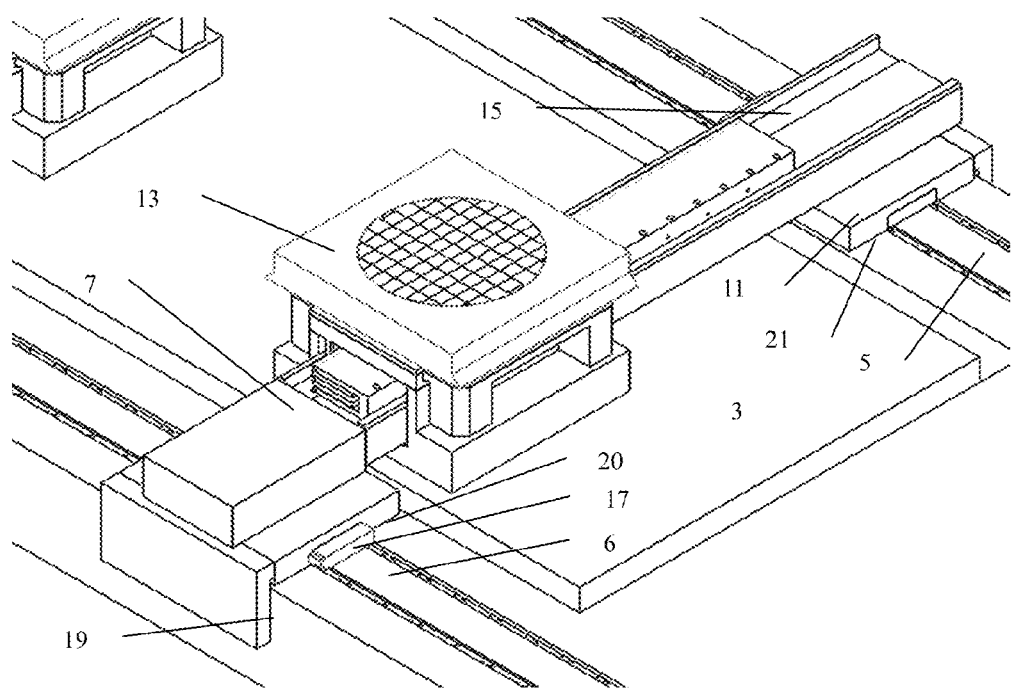
FIG. 3 shows a structure of a driving unit on either side of the wafer stage.
Figure 4:
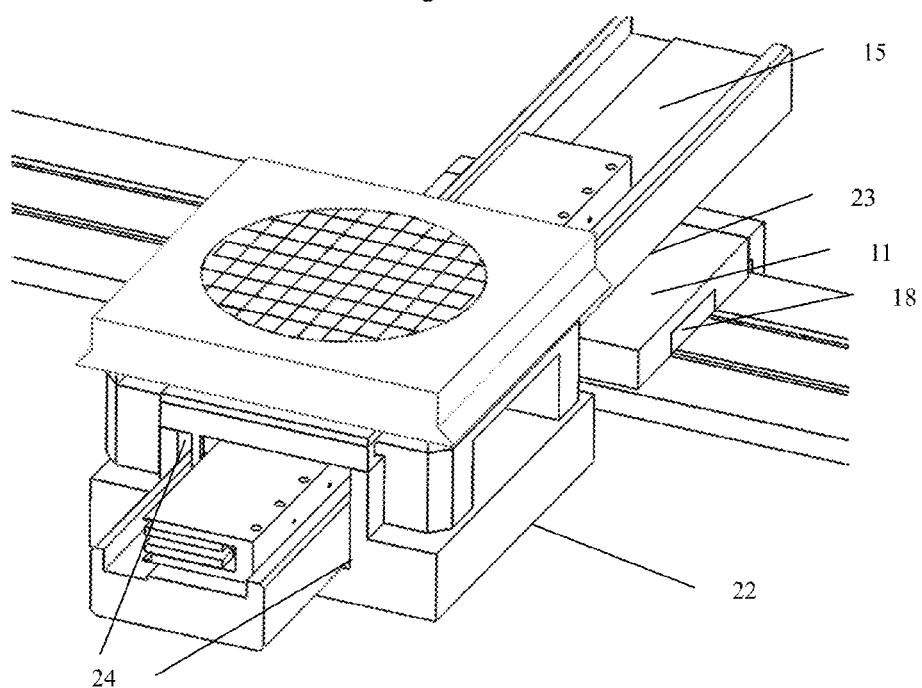
FIG. 4 shows structures of the wafer stage and the Y-direction guide rail.

FIGS. 3 and 4 show structures and connection of the 1-DOF auxiliary driving unit, the wafer stage, the Y-direction guide rail and the main driving unit and arrangement of the air bearing. On the bottom of each of the 1-DOF auxiliary driving units is mounted a linear motor rotor and a vacuum preloaded air bearing and the stator is mounted on the base. When the 1-DOF auxiliary driving unit is butt-jointed with the first Y-direction guide rail 15, it cooperates with the main driving unit to drive the wafer stage to move in X direction. Connection between the Y-direction guide rail and the main driving unit may be implemented by a roller ball guide rail or an air bearing for guiding and by a linear motor or a friction wheel plus motor for driving. The other end of the Y-direction guide rail is connected with one 1-DOF auxiliary driving unit for precise abutting joint via electromagnetism or vacuum suction.

FIG. 4 shows a connection structure of the wafer stage and the Y-direction guide rail. Mounted on the bottom of the first stage 13 is a vacuum preloaded air bearing. The top surface of the base is a guide surface. The first Y-direction guide rail 15 passes through the first stage 13. Mounted on the first Y-direction guide rail 15 is a linear motor stator magnetic steel 21 of the Y-direction guide rail. A coil is mounted on the wafer stage as a rotor of the linear motor. Mounted on the two internal vertical sides of the first stage 13 are closed preloaded air bearings 24 to restrain relative movement in Y direction of the Y-direction guide rail 15 and the first stage 13.

Figure 5:
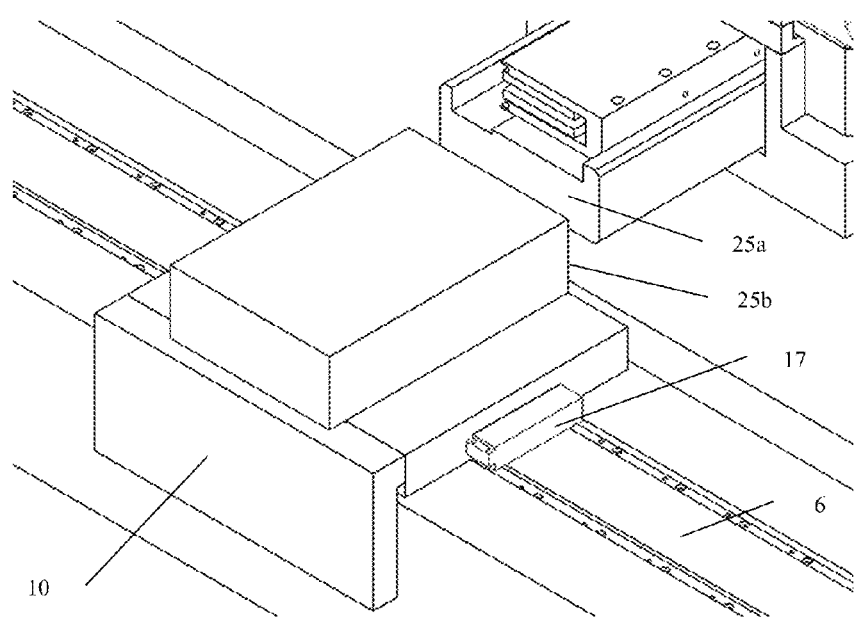
FIG. 5 shows connection among the wafer stage, the Y-direction guide rail, a main driving unit and a single-degree-of-freedom (1-DOF) auxiliary driving unit.

FIG. 5 shows a connection between the Y-direction guide rail and the 1-DOF auxiliary driving unit. The 1-DOF auxiliary driving unit 10 and the first Y-direction guide rail 15 are butt-jointed in such manner that precise abutting joint and detachment may be realized through electromagnetism or vacuum suction, hence allowing position exchange of wafer stages.

Figure 6:
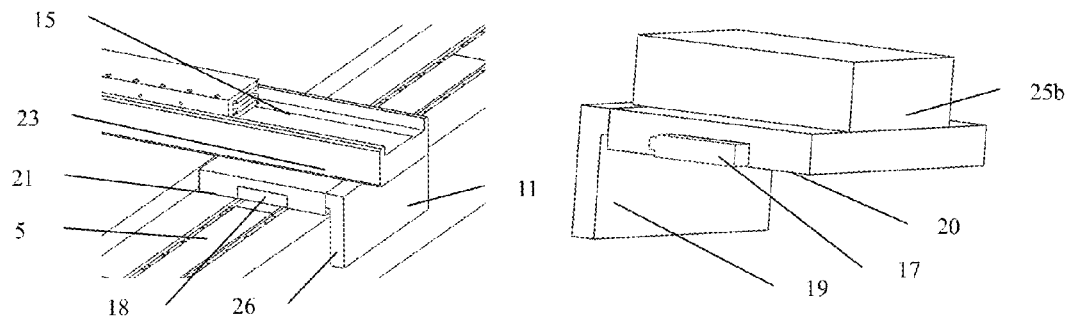
FIG. 6 shows a structure of the 1-DOF auxiliary driving unit.

FIG. 6 shows structures of the main driving unit and the 1-DOF auxiliary driving unit. As previously stated, the main driving unit is a 2-DOF driving unit that mainly drives the stage to move in X direction, and also drives the Y-direction guide rail to move in Y direction. Therefore it has a structure in which a linear motor rotor coil 18 is mounted at the bottom portion thereof, a vacuum preloaded air bearing 19 is mounted on a side surface and a permanent magnetism preload air bearing 20 is mounted on the bottom surface. Connection with the Y-direction guide rail may be implemented by a roller ball guide rail or an air bearing for guiding and by a linear motor or a friction wheel plus stepper motor for driving.

The 1-DOF auxiliary driving unit cooperates with the main driving unit to drive the wafer stages to move in X direction, therefore it has a structure in which a linear motor coil rotor is mounted at the bottom portion thereof, a vacuum preloaded air bearing 19 is mounted on a side surface and a permanent magnetism preloaded air bearing 20 is mounted on the bottom surface.

Figure 7:
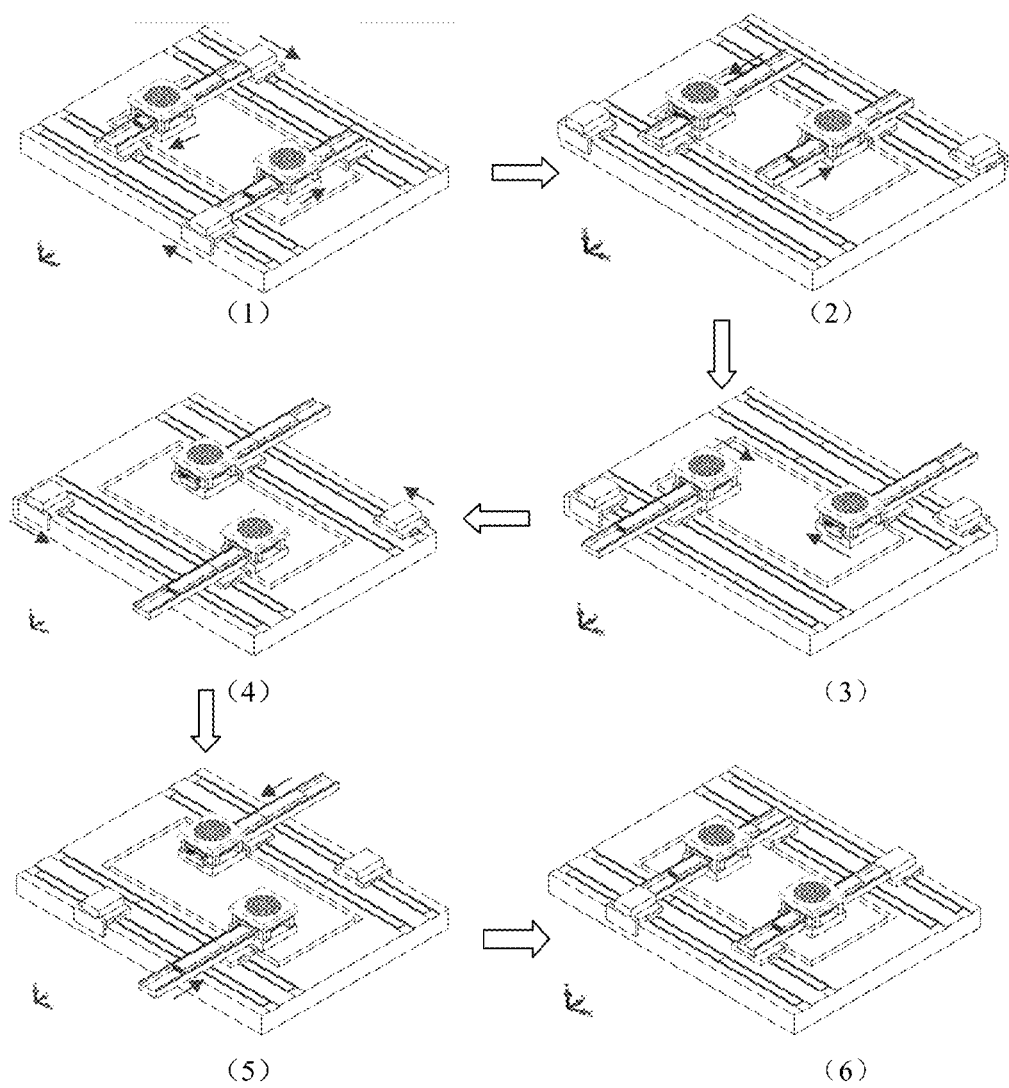
FIG. 7 shows the process in which the two wafer stages make exchange.

FIG. 7 shows the process in which the two stages of said dual-stage exchange system for the lithographic apparatus are exchanged. In FIG. 7(1), at the original positions of the first stage 13 and the second stage 14 before exchange, the first 1-DOF auxiliary driving unit 7 is butt-jointed with the first Y-direction guide rail 15, and cooperates with the first main driving unit 11 to drive the first stage 13 to experience exposure movement at the exposure workstation 3. The second 1-DOF auxiliary driving unit 8 are butt-jointed with the second Y-direction guide rail 16, and cooperates with the second main driving unit 12 to drive the second stage 14 to experience pretreatment movement at the pre-processing workstation 4.

After the wafer stages complete their pretreatment and exposure procedures individually, the system enters an exchange state of the two stage. As indicated by the arrow in FIG. 7, the first stage 13 moves toward the first main driving unit 11 along the first Y-direction guide rail 15 to one side of the base, and the second stage 14 moves toward the second main driving unit 12 along the second Y-direction guide rail 16 to the other side of the base, as shown in FIG. 7(2).

After that, the first 1-DOF auxiliary driving unit 7 separates from the first Y-direction guide rail 15 and moves towards the pre-processing workstation 4 in X direction to arrive at an edge of the base. The second 1-DOF auxiliary driving unit 8 separates from the second Y-direction guide rail 16 and moves towards the exposure workstation 3 in X direction to arrive at another edge of the base, as shown in FIG. 7(3).

Meanwhile, the first Y-direction guide rail 15 retracts towards the first stage 13 to one side of the base, and the second Y-direction guide rail 16 retracts towards the second stage 14 to another side of the base, as shown in FIG. 7(4). The first stage 13, driven by the first main driving unit 11, moves in X direction to an initial position of pre-processing workstation, and the second stage 14, driven by the second main driving unit 12, moves in X direction to an initial position of the exposure workstation.

When the wafer stages arrive at the initial positions of the next stations, the first Y-direction guide rail 15 protrudes to butt with the first 1-DOF auxiliary driving unit 7. Meanwhile, the second Y-direction guide rail 16 protrudes to butt with the second 1-DOF auxiliary driving unit 8, as shown in FIG. 7(5).

Finally, the first stage 13 moves to the initial position of the pre-processing workstation along the first Y-direction guide rail 15, and the second stage 14 moves to the initial position of the exposure workstation along the second Y-direction guide rail 16, as shown in FIG. 7(6). So far, the position exchange of wafer stages is completed and the system enters the next cycle.

The invention claimed is:

1. A dual-stage exchange system for a lithographic apparatus, the system comprising a first stage (13) operating at an exposure workstation (3) and a second stage (14) operating at a pre-processing workstation (4), the two wafer stages being disposed on a same rectangular base (1) with long sides in X direction and short sides in Y direction, the two wafer stages being over a top surface (2) of the base, characterized in that: disposed at the two long sides of the base are a stator (5a) of a first Y linear motor, a stator (5b) of a second Y linear motor, a stator (6a) of a third Y linear motor and a stator (6b) of a fourth Y linear motor respectively, the second 1-DOF auxiliary driving unit (8) uses the stator (5a) of the first Y linear motor, the first main driving unit (11) uses the stator (5b) of the second Y linear motor, the second main driving unit (12) uses the stator (6a) of the third Y linear motor, the first 1-DOF auxiliary driving unit (7) uses the stator (6b) of the fourth Y linear motor; the first Y-direction guide rail (15) passes through the first stage (13) and the second Y-direction guide rail (16) passes through the second stage (14); the first Y-direction guide rail (15) has one end connected with the first main driving unit (11) and the other end butt-jointed with the first 1-DOF auxiliary driving unit (7), the first 1-DOF auxiliary driving unit (7) and the first Y-direction guide rail (15) are in separate structure by which they are disconnected upon position exchange of the two wafer stages; the second Y-direction guide rail (16) has one end connected with the second main driving unit (12) and the other end butt-jointed with the second 1-DOF auxiliary driving unit (8), the second 1-DOF auxiliary driving unit (8) and the second Y-direction guide rail (16) are in separate structure by which they are disconnected upon position exchange of the two wafer stages;

when the two wafer stages exchange their positions, first of all, the first stage (13) moves toward the first main driving unit (11) along the first Y-direction guide rail (15), and the second stage (14) moves toward the second main driving unit (12) along the second Y-direction guide rail (16); then, the first Y-direction guide rail (15) separates from the first 1-DOF auxiliary driving unit (7) and moves toward the first main driving unit (11), and the second Y-direction guide rail (16) separates from the second 1-DOF auxiliary driving unit (8) and moves toward the second main driving unit (12); then, the first main driving unit (11) and the second main driving unit (12) drive the first stage (13) and the second stage (14) respectively to experience position exchange in X direction, at the same time, the second 1-DOF auxiliary driving unit (8) moves to an initial position of the exposure workstation (3), and the first 1-DOF auxiliary driving unit (7) moves to an initial position of the pre-processing workstation (4); finally, the first Y-direction guide rail (15) and the second 1-DOF auxiliary driving unit (8) are butt-jointed together, and the first stage (13) moves to an initial position of the pre-processing workstation (4), the second Y-direction guide rail (16) and the first 1-DOF auxiliary driving unit (7) are butt-jointed, and the second stage (14) moves to an initial position of the exposure workstation (3), the exchange is completed and the system enters a next cycle.

2. The dual-stage exchange system for a lithographic apparatus according to claim 1, characterized in that: said first 1-DOF auxiliary driving unit (7) and said second 1-DOF auxiliary driving unit (8) are both provided with linear motor rotors (17) at their bottom, each 1-DOF auxiliary driving unit is provided with a vacuum preloaded air bearing (19) on its side that contacts the base, each 1-DOF auxiliary driving unit is provided with a permanent magnetism preloaded air bearing (20) on its bottom surface that contacts the base; said first main driving unit (11) and said second main driving unit (12) are 2-DOF driving units that are each mounted at the bottom thereof a linear motor rotor (17) same as that of the 1-DOF auxiliary driving unit, each main driving unit is provided with a vacuum preloaded air bearing (19) on its side that contacts the base, each main driving unit is provided with a permanent magnetism preloaded air bearing (20) on its bottom surface that contacts the base, and further, between a top of each main driving unit and the Y-direction guide rail, a roller ball guide rail or an air bearing is mounted for guiding and a linear motor or a friction wheel plus stepper motor is mounted for driving, so as to enable the main driving unit to drive and support the Y-direction guide rail.

3. The dual-stage exchange system for a lithographic apparatus according to claim 2, characterized in that: a linear grating for position feedback is mounted on the linear motor of each said driving unit respectively.

4. The dual-stage exchange system for a lithographic apparatus according to claim 1, characterized in that: said dual-stage exchange system for the lithographic apparatus further comprises a dual frequency laser interferometer for position feedback of wafer stage movement.

\* \* \* \* \*